(12) United States Patent
Hessler et al.

(10) Patent No.: US 11,234,147 B2
(45) Date of Patent: Jan. 25, 2022

(54) COHERENCE BANDWIDTH ADAPTIVE CSI REPORTING

(71) Applicant: Telefonaktiebolaget LM Ericsson (publ), Stockholm (SE)

(72) Inventors: Martin Hessler, Linköping (SE); Henrik Sahlin, Mölnlycke (SE); Zhao Wang, Solna (SE); Karl Werner, Segeltorp (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 16/335,579

(22) PCT Filed: Sep. 30, 2016

(86) PCT No.: PCT/SE2016/050934
§ 371 (c)(1),
(2) Date: Mar. 21, 2019

(87) PCT Pub. No.: WO2018/063044
PCT Pub. Date: Apr. 5, 2018

(65) Prior Publication Data
US 2020/0022009 A1     Jan. 16, 2020

(51) Int. Cl.
| | |
|---|---|
| *H04W 24/10* | (2009.01) |
| *H04B 7/0456* | (2017.01) |
| *H04B 7/06* | (2006.01) |
| *H04L 5/00* | (2006.01) |
| *H03M 3/00* | (2006.01) |
| *H03H 17/02* | (2006.01) |

(52) U.S. Cl.
CPC .......... *H04W 24/10* (2013.01); *H03M 3/496* (2013.01); *H04B 7/0456* (2013.01); *H04B 7/0626* (2013.01); *H04L 5/0051* (2013.01); *H03H 17/0289* (2013.01)

(58) Field of Classification Search
CPC ........ H04B 7/0626; H04B 17/24; H04B 7/12; H04L 1/0687; H04L 1/0693; H03M 3/496; H03H 17/0289
See application file for complete search history.

(56) References Cited

U.S. PATENT DOCUMENTS

| | | | |
|---|---|---|---|
| 7,676,007 B1* | 3/2010 | Choi .................... | H04B 7/0634 375/347 |
| 2007/0211823 A1* | 9/2007 | Mazzarese ............ | H04W 52/42 375/299 |

(Continued)

FOREIGN PATENT DOCUMENTS

WO     2016120454 A1     8/2016

OTHER PUBLICATIONS

International Search Report and Written Opinion dated May 23, 2017 for International Application No. PCT/SE2016/050934 filed on Sep. 30, 2016, consisting of 11-pages.

*Primary Examiner* — Salvador E Rivas
(74) *Attorney, Agent, or Firm* — Christopher & Weisberg, P.A.

(57) ABSTRACT

This disclosure pertains to a wireless device for a Radio Access Network, the wireless device being adapted for transmitting sampling information indicating a sample determining device used by the wireless device for preparing a measurement report. The disclosure also pertains to related methods and devices.

11 Claims, 9 Drawing Sheets

(56) References Cited

U.S. PATENT DOCUMENTS

| | | | | |
|---|---|---|---|---|
| 2010/0329369 A1* | 12/2010 | Hou | ............... | H04B 7/0452 |
| | | | | 375/260 |
| 2011/0080969 A1* | 4/2011 | Jongren | ............... | H04B 7/0634 |
| | | | | 375/267 |
| 2013/0058245 A1* | 3/2013 | Van Lieshout | ... | H04W 36/0094 |
| | | | | 370/252 |
| 2017/0279579 A1* | 9/2017 | Qian | ............... | H04W 72/0406 |

* cited by examiner

COHERENCE BANDWIDTH ADAPTIVE CSI REPORTING

CROSS-REFERENCE TO RELATED APPLICATIONS

This application is a Submission Under 35 U.S.C. § 371 for U.S. National Stage Patent Application of International Application Number: PCT/SE2016/050934, filed Sep. 30, 2016 entitled "COHERENCE BANDWIDTH ADAPTIVE CSI REPORTING," the entirety of which is incorporated herein by reference.

TECHNICAL FIELD

The present disclosure pertains to wireless communication technology, in particular Radio Access Technology.

BACKGROUND

In many wireless communication networks, Downlink Reference Signals (DL-RSs) are used to enable the UE to estimate the DL channel and then report the obtained measurements to the base-station (CSI reporting). The CSI reporting can be done in multiple formats, for example, explicit channel estimates, pre-coder information etc. The larger the antenna arrays become, the more the amount of feedback increases.

5G systems are expected to support larger and larger antenna arrays; up to 256 antennas should be supported according to current understanding in 3GPP.

This may lead to the amount of data in CSI reports for a large number of antennas increasing, as the channel matrix scales with the product of the number of receiver antennas and the number of transmit antennas. Another issue may be that the estimation quality per antenna decreases, both due to the facts that high compression is needed in reports, and that the available output power per antenna may decrease such that the per antenna estimation quality decreases, the estimation quality per antenna decreases, i.e. the information content per antenna may decrease. Therefore, the demand for processing gain increases.

Another problem with current pre-coder procedures is that in many cases the precoding is carried out block wise, e.g., a fixed pre-coder may be applied for a group of N resource blocks, and then a new pre-coder is applied for the next group of N resource blocks. This implies that sudden changes in the effective channel (physical channel including precoding) may be present in between the blocks. These potential discontinuities of the effective channel imply that the channel estimation on the receiver side needs to be done block-wise, which implies that the channel estimation suffers as it gets many edge-effects and a limitation in the choices of filter for the receiver to use for gaining processing gain. Note that even if the actual effective channel is smooth across several groups of PRBs, due to low delay spread and the same pre-coder being applied to several consecutive groups, the channel estimation is limited to the groups of N resource blocks. This is because the precoding operation is transparent to the receiver. This forces the receiver to be conservative in the sense that no interpolation is performed across the aforementioned group of PRBs even if the actual channel conditions would allow it.

Moreover, in order to achieve good CSI quality, a large number of pre-coders need to be signaled to cover the entire band. This requires a significant control channel capacity.

SUMMARY

It is an object of the present disclosure to provide approaches allowing improved measurement report, respectively improvements related to reference signaling and/or processing of reference signaling.

There is disclosed a wireless device for a Radio Access Network. The wireless device is adapted for transmitting sampling information indicating a sample determining device used by the wireless device for preparing a measurement report. The wireless device may comprise a transmitting module for such transmitting.

There is also disclosed a method for operating a wireless device in a Radio Access Network. The method comprises transmitting sampling information indicating a sample determining device used by the wireless device for preparing a measurement report.

With transmitting the sampling information, another node of the network, e.g. a wireless precoding node, may be informed about the sample determining device used, such that it (or another node of the network), may adapt its own transmissions, in particular its precoding, accordingly. For example, if the precoding device knows (from the indication of the sample determining device) which frequencies the wireless device considers noise (because it filters them out, e.g. using a low-pass filter as sampling determining device to filter out high frequencies considered noise), it can adapt its precoder accordingly. By providing corresponding information, the wireless device facilitates this precoding.

The sampling information may explicitly or implicitly indicate the sampling determining device. For example, the information may be implicit from the samples (and/or sample density, e.g. in frequency domain, and/or frequency range covered by the samples) provided and/or included in the measurement report, e.g. based on assuming a specific type of sampling determining device is used. For example, if a low-pass filter, respectively a SINC or windowed SINC, type filter is used, the sample determining device may be indicated by the samples and/or sample density and/or range of frequencies represented in the samples. Alternatively or additionally, the sampling determining device may be explicitly indicated, e.g. by one or more parameters and/or indexes and/or pointers indicating and/or identifying and/or mapping the sampling determining device. It may be considered that sampling information indicates a frequency variation, e.g. coherence bandwidth and/or delay spread, in particular pertaining to measurements the measurement report pertains to. It may be considered that samples are determined based on the frequency variation.

Transmitting sampling information may be targeted at a wireless precoding node, in particular at a wireless precoding node providing reference signaling, on which measurements may be performed, to which samples and/or the measurement report pertain. The measurement report may generally be based on and/or pertain to measuring or measurement performed on signaling, in particular reference signaling. The reference signaling may comprise cell-specific signaling and/or user-specific signaling, e.g. CSI-RS (Channel State Information Reference Signaling) and/or DMRS (DeModulation-Reference Signaling).

The wireless device may be adapted for, and/or comprise a reporting module for, and/or the method for operating a wireless device may comprise, preparing the measurement report, e.g. using and/or based on the sampling determining device. Alternatively or additionally, it may be considered that the wireless device may be adapted for, and/or comprise a selecting module for, and/or the method for operating a wireless device may comprise, selecting a sampling determining device, e.g. for preparing and/or for use in preparing a measurement report. Such selecting may comprise selecting out of a plurality of available and/or pre-defined sampling determining devices and/or selecting parameters for the sampling determining device, e.g. upper and/or lower cut-off frequency/ies, and/or sampling density, etc. The sampling determining device may generally be selected based on a frequency variation of the measured signaling, in particular reference signaling. A frequency variation may generally be represented e.g. by a frequency domain and/or time domain analysis and/or parametrization, e.g. by a coherence bandwidth (which may e.g. represent a frequency bandwidth over which the frequency varies little and/or remains essentially constant) and/or a delay-spread (which may be considered a time-domain measure of frequency variation). The variation may be evaluated over, and/or pertain to a given time interval, e.g. a measuring interval, and/or a pre-defined time interval, which may e.g. a fraction or multitude of a measuring interval.

Generally, the sample determining device may comprise a filter. The sample determining device may be implemented in hardware and/or software, in particular as a software filter, in particular in or for control and/or radio circuitry. The sample determining device may be adapted to determine which samples are to be prepared in or for a measurement report, and/or in which density (e.g., density in frequency) and/or which number of samples and/or over which range (e.g., in frequency), and/or which precision (e.g., number of bits) is provided and/or assigned for one or more samples, in particular for each sample. The sample determining device may in particular be implemented as a SINC filter, especially a windowed SINC filter. It may be considered that the sample determining device (in particular a SINC filter/windowed SINC filter) may be implemented to determine and/or define an upper limit for samples, e.g. in frequency), in particular it may be implemented as lo-pass filter. The upper limit (cut-off) may be related and/or based on a determination of a high frequency range representing noise. The sample determining device may be implemented as a module, e.g. a software module. It may be considered that the sample determining device is generally adaptable. The wireless device may be adapted for, and/or comprise an adaption module for, and/or the method for operating the wireless device may comprise, adapting the sample determining device based on a frequency variation or corresponding characteristic of received reference signaling. The sample determining device may be additionally or alternatively utilize transformation methods, e.g. based on FFT (Fast Fourier Transform or equivalent) or other frequency (and/or associated time domain) analyzing techniques, e.g. wavelet based transformation. Generally, the sample determining device may be considered to represent the approach and/or method and/or software and/or hardware used for determining samples. The samples determined may represent the samples indicated and/or included in a measurement report. Samples may represent specific frequencies and/or frequency ranges (e.g., associated to corresponding taps) in a frequency range over which measurements on signaling, in particular reference signaling, and/or associated processing is performed (e.g., by the wireless device, which may comprise a measuring module for performing measurements and/or measuring). Each sample may represent or pertain to one or more parameters associated to the frequency and/or frequency range, e.g. representing channel state information, and/or channel quality and/or reception power and/or signal quality (e.g., in terms of SIN, SINR or similar), and/or channel/precoder estimates, e.g. CQI and/or PMI and/or RI.

In some variants, the sampling information may be transmitted in a measurement report, into which it may be included. A measurement report may comprise one or more messages transmitted, e.g., to a wireless precoding device or in uplink, if the precoding device or target of the report is a network node. It may generally be considered that in the alternative, the sampling information indicating the sample determining device is transmitted separately from the measurement report it pertains to, e.g. in a summary report and/or dedicated control signaling.

The sample determining device may be adapted for, and/or determining samples may comprise, determining a sample density in frequency, and/or a number of samples for one or more frequency ranges. There may be different sample densities for different frequency ranges covered by a measurement report. For a given number of bits available for a measurement report, the sample density (or number of samples) determines how many bits are available for each sample, such that the resolution of the report (quality of information for each sample) is dependent on the density/number. Approaches described herein thus allow adapting the information quality.

Sampling information and/or a measurement report may pertain to one or more different reference signalings, e.g. reference signaling utilising different precoders.

There is also considered a wireless precoding device for a Radio Access Network. The wireless precoding device is adapted for transmitting signaling based on precoding, the precoding being based on sampling information indicating a sample determining device used by a (another) wireless device for preparing a measurement report. The wireless precoding device may comprise a precoder or precoding module for precoding and/or a transmitting module for transmitting signaling.

Moreover, a method for operating a wireless precoding device in a Radio Access Network is proposed. The method comprises transmitting signaling based on precoding, the precoding being based on sampling information indicating a sample determining device used by another wireless device for preparing a measurement report.

The (other) wireless device may prepare and/or transmit the measurement report, e.g. to the wireless precoding device. The measurement report may be received by the wireless precoding device.

The wireless precoding device may be adapted for, and/or comprise a reference signaling module for, and/or the method for operating a wireless precoding device may comprise, transmitting reference signaling, e.g. to the wireless device. The measurement report and/or sampling information may pertain to the transmitted reference signaling. In some variants, the wireless precoding device may be adapted for, and/or comprise a (report) receiving module for, and/or the method for operating a wireless precoding device may comprise, receiving a measurement report, in particular a measurement report to which the sampling information pertains. The sampling information may be received with, and/or be included in the measurement report.

Accordingly, the precoding device may adapt its transmission to the sample determining device, respectively its function, allowing improved transmission.

It may be considered that the precoding is additionally based on the measurement report, in particular samples included therein and/or based on channel/precoder information or channel state information included therein, e.g. CQI and/or PMI and/or RI.

Transmitting signaling based on precoding may be based on a representation of the sample determining device, for example an approximation thereof, e.g. by interpolation or extrapolation. It may be sufficient to approximate the sample determining device without representing it exactly to improve precoding and/or determine an improved precoder. The representation may for example correspond to an assumption of the sampling determining device used, and/or of a frequency range acceptable based on the sampling information. Generally, transmitting signaling based on pre-coding may be based on and/or utilise a frequency limitation or selection device, which may be based on the representation. Such a frequency limitation or selection device may in particular comprise a filter like an interpolation filter and/or windowed filter, and/or a frequency raking device. The frequency limitation or selection device may be adapted or selected or calculated or determined based on the representation of the sample determining device, e.g. to match or essentially/approximately match its frequency behaviour, in particular regarding high frequencies (high in particular in relation to an upper cutoff frequency). The frequency limitation or selection device may for example be based on and/or represent a SINC or windowed SINC, in particular if the sample determining device represents such. Generally, a frequency limitation and/or selection device may be implemented in software and/or hardware, in particular in or for control and/or radio circuitry. In general, a frequency limitation or selection device may be frequency and/or time selective, in particular frequency and time selective, e.g. limiting transmission in frequency and/or time.

There may also be considered a program product comprising instructions adapted for causing control circuitry to control and/or perform any one of the methods described herein.

A carrier medium is disclosed, the carrier medium carrying and/or storing a program product as described herein, and/or instructions adapted for causing control circuitry to control and/or perform any one of the methods described herein.

Also, there may be considered a wireless communication system comprising a wireless device as described herein, and/or a wireless precoding device as described herein. In particular, the wireless device may be a terminal and the wireless precoding device may be a network node, or vice versa.

A wireless precoding device may be any device adapted for precoding. A wireless precoding device may comprise and/or be connected or connectable, e.g. to utilise for transmitting based on precoding, a multi-antenna array. A wireless precoding device may in particular be implemented as network node, e.g. a radio node and/or base station. However, a terminal utilising a multi-antenna array and/or precoding may also be considered representing a wireless precoding device.

A wireless device may be any device adapted to provide a measurement report and/or corresponding sampling information as described herein. In particular, a terminal may be considered a wireless device. However, a network node performing similar measurements and/or providing a measurement report may also be considered a wireless device. The term "wireless" herein indicates a mode of signaling or transmitting, namely wireless and/or over an air interface and/or using radio waves/frequencies.

Preparing a measurement report may comprise providing and/or determining and/or collecting and/or processing and/or formatting information to construct a measurement report. Preparing may comprise constructing the report, and/or inserting the related information into the report. Preparing may be based on measurement performed and/or measuring. It may be considered that preparing a measurement report is part of a CSI process.

The sampling determining device may in particular be used for preparing a measurement report. It may be considered that the device, or a device based on it, may be used for handling and/or receiving other kinds of signaling, e.g. data signaling (signaling pertaining to data other than reference signaling). However, it may be considered that, since the wireless precoding device, when receiving the sampling information, may adapt its precoding and/or transmission accordingly, no use for a sampling determining device is necessary unless indicated when preparing measurement reports.

BRIEF DESCRIPTION OF THE DRAWINGS

The drawings are provided to illustrate concepts and approaches described herein, and are not intended to limit their scope. The drawings comprise.

DETAILED DESCRIPTION

In the following, by way of example, it is referred to a transmitter and a receiver. The transmitter may be considered to represent a wireless precoding device, whereas the receiver may be considered to represent a wireless device. In specific examples, the transmitter may be a network node (e.g., eNodeB), the receiver a terminal. However, as outlined above, the roles may be reversed, e.g. if a terminal is adapted for precoding. Indeed, both devices may be able to take both roles, in similar process, depending on which device prepares the measurement report and which device uses precoding at a given point in time and/or for specific transmissions.

There is proposed an approach related to measurement reporting. The approach uses the underlying structure of the estimation problem. This structure is that the transmitter in its pre-coder selection algorithms will use knowledge about the properties of at least the frequency and time domain properties of the radio channel for the estimation. In the current state of the art solutions this information that the UE has is typically lost. But it is in fact very valuable and if one can in the reporting include this information and also pick a matching time and frequency domain sampling in the CSI reporting, this approach will tend to optimal CSI reporting. Accordingly, suitable sampling information may be provided.

Generally, there may be considered a method for communicating channel state information from a wireless device, and/or a correspondingly adapted wireless device. The channel state information may e.g. comprise sampling information and/or a measurement report. The method may comprise, and/or the wireless device may be adapted for, and/or comprise a receiving module for, receiving a (e.g., downlink or reverse link) reference signal, or generally for receiving reference signaling. The method may optionally comprise, and/or the wireless device may be adapted for, and/or comprise a variation determining module for, performing a determination of, e.g. a measurement and/or analysis and/or calculation and/or estimation of, frequency variation of and/or pertaining to the reference signal, e.g. a coherence bandwidth (and/or delay-spread).

The wireless device may be adapted for, and/or comprise an estimating module for, and/or the method may comprise generating channel and/or pre-coder estimates with a frequency density according to frequency variation, e.g. a coherence estimate as determined. This may be considered a variant of preparing a measurement report. Using the frequency density may be considered to represent using a sample determining device, e.g. to select the frequency density, which may be considered to determine the samples in frequency space used for the measurement report respectively its preparation. The method for operating the wireless device may include, and/or the wireless device may be adapted for, and/or comprise a transmitting module for, transmitting one or more measurement reports, e.g. CSI reports, which may include sampling information, e.g. information about the coherence bandwidth and/or delay-spread, and/or channel/pre-coder information, e.g. CQI and/or PMI.

There may be considered a wireless device for performing pre-coding (which may be considered a wireless precoding device), respectively a method for operating such. The wireless precoding device may be adapted for, and/or comprise a receiving module for, and/or the method may comprise, receiving a measurement report, e.g. a CSI-report, which may include channel state information, e.g. channel/pre-coder estimates, e.g. CQI and/or PMI, and/or receiving sampling information, e.g. in the measurement report or separate therefrom. The sampling information may indicate e.g. (implicitly or explicitly) coherence bandwidth (and/or delay-spread) properties, e.g. of samples and/or used for determining samples in the report. Thus, the sampling information may be considered representative for the sampling determining device used for preparing the measurement report. The method may comprise, and/or the wireless device maybe adapted for, and/or comprise a frequency limiting module for, determining a frequency limitation or selection device, e.g. by generating an interpolation filter (representing the device) based upon said sampling information, e.g. coherence bandwidth properties. It may be considered that the wireless precoding device may be adapted for, and/or comprise a precoding module for, and/or the method may comprise determining one or more precoders (as a form of precoding, not that determining the frequency limitation or selection device may be implemented as part of precoding), e.g. by calculating one or more precoders, e.g. frequency/time selective pre-coders, based on the frequency limitation or selection device, e.g. the interpolating filter, and/or the channel state information and/or measurement report, in particular channel/precoder estimates. The method may further comprise, and/or the wireless precoding device may be adapted for, and/or comprise a transmitting module for, transmitting signaling, e.g. data or data signaling, using the determined precoder/s.

The proposed approaches facilitate

Reduced control channel load as fewer precoders are reported when coherence bandwidth is large (e.g. LOS case).

Improved performance in the CSI reporting and hence precoder selection as more precoders may be reported if the channel is frequency selective.

Improved performance in the channel estimation step in the actual transmission as interpolation across larger bandwidth is enabled if precoders are applied with smooth transitions according to the new information available in the precoder selection algorithms at the precoding device respectively on the network side.

The following variants may be implemented individually, or in combination.

In a variant, the frequency variation or coherence of the channel (respectively, the reference signaling, which are transmitted on the channel that is estimated) may be estimated as the delay spread of the channel. It may be generally considered that in a variant the frequency variation or coherence may be determined as, and/or based, on a selection among a plurality of pre-determined frequency filters. In another variant, the frequency variation or coherence may be determined as, and/or based on, a selection among a plurality of pre-determined time-domain filters.

In a further variant, the frequency limitation or selection device, in particular an interpolation filter, may be selected among a plurality of frequency domain filters. It may be considered, that in a variant, the frequency limitation or selection device, e.g. an interpolation filter, is represented by zero-padding of a missing part of a time domain response. In another variant, the frequency limitation or selection device, e.g. an interpolation filter, may be determined to be zero-order-hold across the interpolation points. In other variants, a higher-order interpolation may be utilised. The sampling information may indicate whether a zero-order-hold is to be used, e.g. if channel conditions and/or interference conditions (transmission conditions) are poor, and/or the wireless device has poor reception capabilities.

It may be considered that, in a variant, the measurement report, e.g. a CSI-report, contains information, e.g. in a header, indicating a number of channel/pre-coding samples in said CSI-report, which implicitly indicate the sample determining device, e.g. the filter used may be implicitly determined based on the number of samples. In some variant thereof, the number of samples in the report may be signaled separately from the samples or the report itself.

It may be considered that the size of a measurement/CSI report is fixed (e.g., predetermined, for example by a standard). The information about the number of samples in this case may also determine the quantization of the channel/pre-coder samples (e.g., the number of bits available therefor). In a variant, the quantization may be defined as the number of bits per antenna for the channel vectors. A variant is disclosed in which the quantization pertains to and/or is based on a plurality of code-books, wherein the number of entries of a code-book may scale with the resolution in the quantization. In a variant, the interpolation filter may represent a SINC function, in a specific variant the filter may represent a windowed SINC function. Generally, in there may be considered that the interpolation (for the corresponding filter) is based on a minimization problem using an FFT, wherein the filter setting may be the number of non-zero values to optimize over in the said minimization problem. This implies that the placement of a fixed number of taps in the time domain can be found to minimize the error compared to the signaled frequency information in the measurement or CSI report.

There may be considered a variant in which the number of samples (e.g., representing the number of reported precoding samples) is determined based on the measured channel characteristics and a threshold. The threshold may be dynamically signaled by the network, configured by a network node or a wireless precoding device, or fixed in specifications.

The maximum interpolation bandwidth of the channel estimator filters in a variant may be determined based on previously reported channel state information (e.g., CSI, e.g. CQI and PMI), and/or precoding/CSI information.

When performing an estimate on the receiver side (in this example, the terminal or UE side), the UE needs to estimate the coherence bandwidth (delay spread) of the channel and an estimate of the SINR. These two parameters are used to calculate an "estimated optimal" filter. This filter is wide in frequency domain (short in time domain) if the coherence bandwidth is wide. The filter is also made wider if the estimated SINR is low due to that you want to gain processing gain by making the filter wider.

The filter (representing a sample determining device) acts as a low-pass filter hence will limit the frequency content in the channel estimate. This implies that according to Nyquist's theorem, fewer samples are needed in frequency domain if the filter is a SINC function (in frequency domain), while maintaining perfect reconstruction on the transmitter side (e.g., network side) using the SINC function. The same should hold true (i.e. errors below quantization noise) as a suitable filter is chosen. One candidate is some type of windowed SINC function, pertaining to which it is known that the error term goes to zero when the filter length goes to infinite.

If the receiver/UE reports pre-coders (e.g., a CSI/PMI information), the same holds true for beam-forming wideband type pre-coders (i.e. pre-coders optimizing the signal from the UE without consideration to interference from other UEs).

Figure 1:
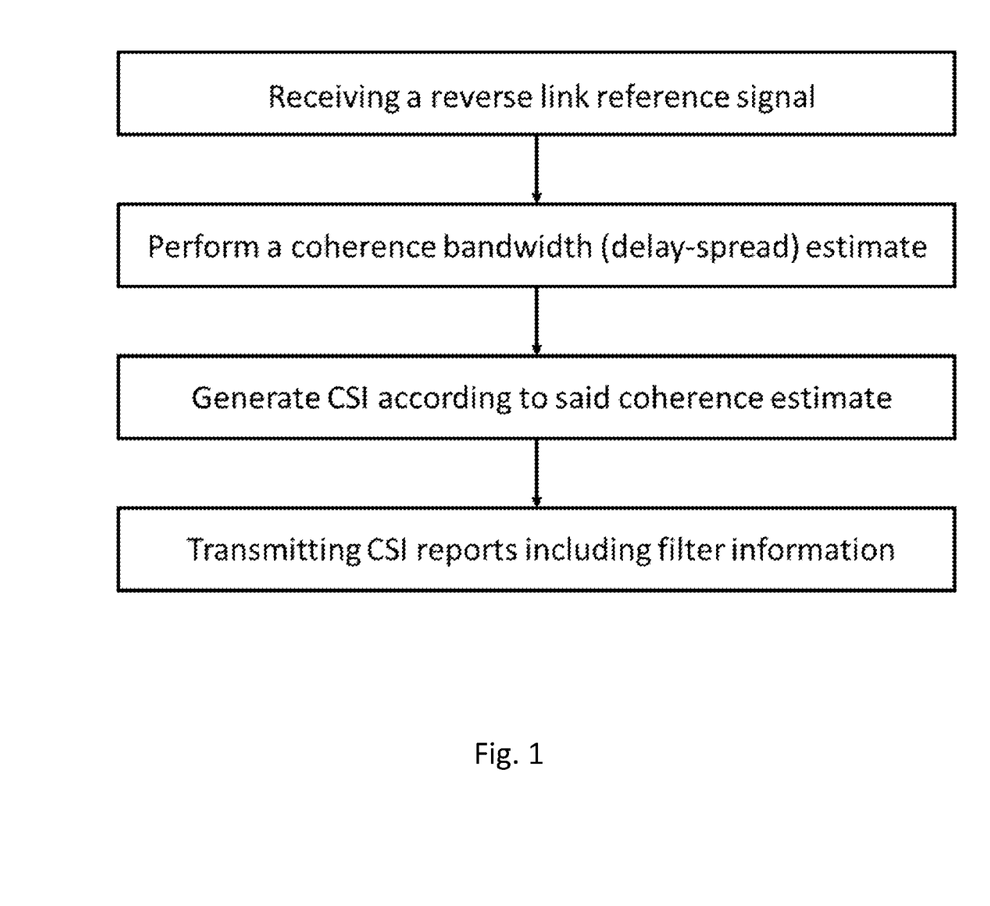
FIG. 1, showing an exemplary wireless device procedure for a coherence bandwidth adaptive CSI-report.

One implementation of the concept as shown in FIG. 1 may comprise a method for communicating channel state information from a wireless device, including receiving a (e.g., reverse link or downlink) reference signal; performing a measurement (e.g. frequency variation like coherence bandwidth or delay-spread) estimate on the said reference signal; generating channel and/or pre-coder estimates with a frequency density according to the said measurement; transmitting CSI reports including information about at least of both said coherence and channel/pre-coder information.

Figure 2:
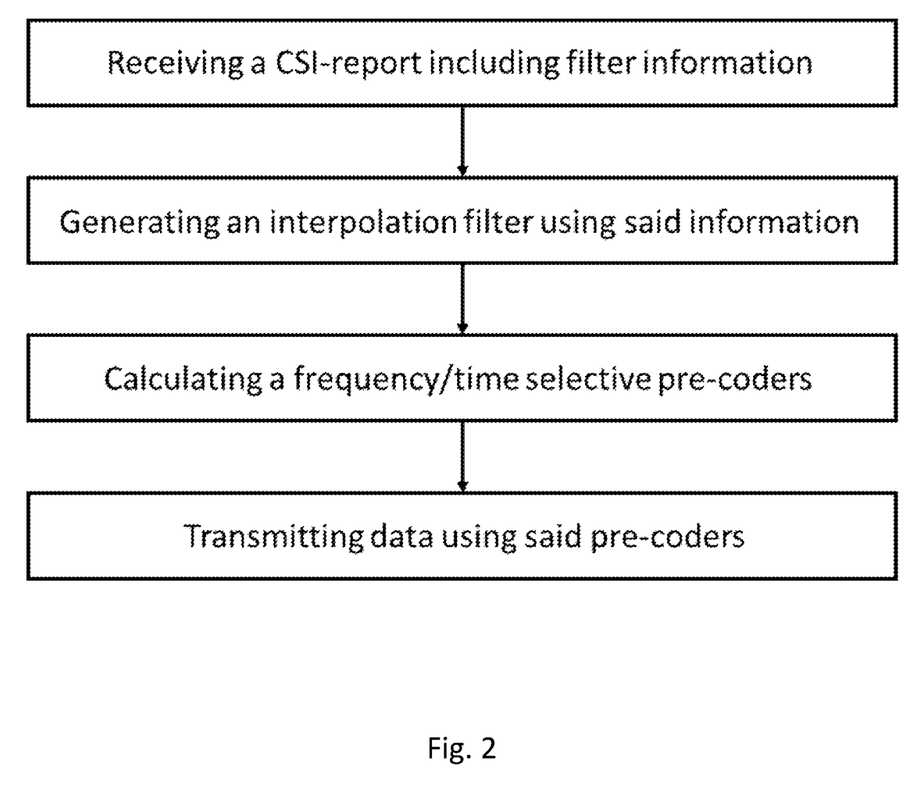
FIG. 2, showing an exemplary transmitter procedure for frequency selective pre-coding using interpolation filter.

Another implementation of the concept as shown in FIG. 2 may comprise a wireless (precoding) device adapted for, and/or a method comprising performing pre-coding including the steps of receiving a CSI-report including channel/pre-coder estimates; receiving a CSI-report including coherence bandwidth (or delay-spread) properties (e.g. as may be inferred from the number of reported precoder estimates); generating an interpolation filter based upon said coherence bandwidth properties; and calculating a frequency/time selective pre-coders from said estimates and said interpolation filter.

Figure 3:
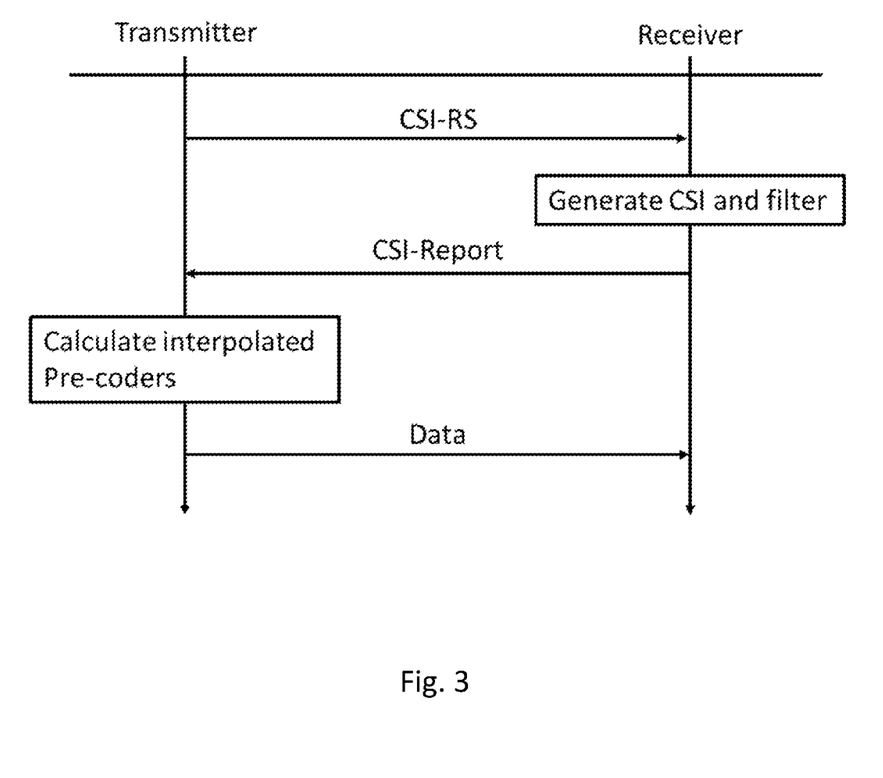
FIG. 3, showing an overview of coherence bandwidth CSI procedure.

FIG. 3 shows an overview of an exemplary CSI procedure, with a transmitter performing as indicated with reference to FIG. 2 interacting with a receiver (wireless device) as indicated with reference to FIG. 1.

The approaches described herein facilitate better and frequency selective precoding. Using frequency selective pre-coding at the transmitter has the advantage, that the effective channel becomes smother and much easier to estimate at the receiver, which implies potentially much higher performance enabled by better utilization of a large antenna array. There is also the added benefit of reducing control channel load (overhead).

Figure 4:
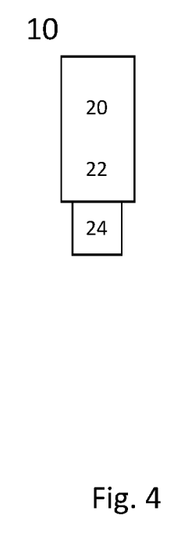
FIG. 4, showing an exemplary wireless device.

FIG. 4 schematically shows a wireless device 10, which may be considered an example for a receiver or wireless device as described herein. Wireless device 10 comprises control circuitry 20, which may comprise a controller connected to a memory. Any module of the wireless device, e.g. receiving module and/or transmitting module and/or sample determining device may be implemented in and/or executable by, the control circuitry 20, in particular as module in the controller. Wireless device 10 also comprises radio circuitry 22 providing receiving and transmitting or transceiving functionality, the radio circuitry 22 connected or connectable to the control circuitry. An antenna circuitry 24 of the terminal 10 is connected or connectable to the radio circuitry 22 to collect or send and/or amplify signals. Radio circuitry 22 and the control circuitry 20 controlling it are configured for cellular communication with a network. The wireless device 10 may be adapted to carry out any of the methods for operating a wireless device disclosed herein; in particular, it may comprise corresponding circuitry, e.g. control circuitry.

Figure 5:
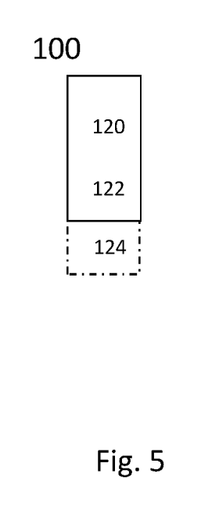
FIG. 5, showing an exemplary wireless precoding device.

FIG. 5 schematically show a wireless precoding device 100, like a network node or base station, which in particular may be an eNodeB or similar for NR. Wireless precoding device 100 comprises control circuitry 120, which may comprise a controller connected to a memory. Any module, e.g. receiving module and/or transmitting module and/or configuring module of the wireless precoding device may be implemented in and/or executable by the control circuitry 120. The control circuitry is connected to control radio circuitry 122 of the network node 100, which provides receiver and transmitter and/or transceiver functionality. An antenna circuitry 124 may be connected or connectable to radio circuitry 122 for signal reception or transmittance and/or amplification. The wireless precoding device 100 may be adapted to carry out any of the methods for operating a network node disclosed herein; in particular, it may comprise corresponding circuitry, e.g. control circuitry. The antenna circuitry may be connected to and/or comprise an antenna array. The wireless precoding device 100, respectively its circuitry, may be adapted to perform precoding. In particular, the antenna circuitry may comprise and/or be connected or connectable to a multi-antenna array.

Figure 6:
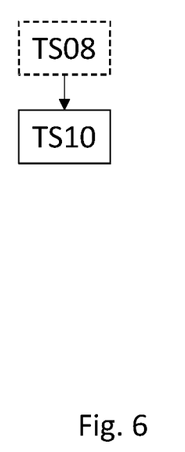
FIG. 6, showing a flow diagram of an exemplary method for operating a wireless device.

FIG. 6 shows a flow diagram indicating an algorithm for a method for operating a wireless device as described herein. The method may comprise an action TS10 of transmitting sampling information indicating a sample determining device used by the wireless device (10) for preparing a measurement report. The method optionally may comprise an action TS08 of preparing a measurement report.

Figure 7:
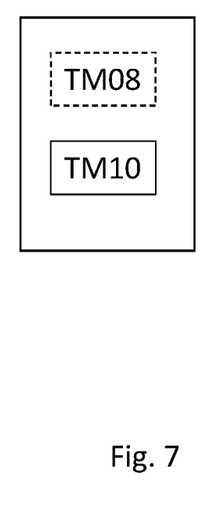
FIG. 7, showing an exemplary wireless device.

FIG. 7 shows a wireless device for a RAN, e.g. a wireless device as described herein. The wireless device comprises a module TM10 for performing action TS10. Optionally, it may comprise a module TM08 for performing action TS08.

Figure 8:
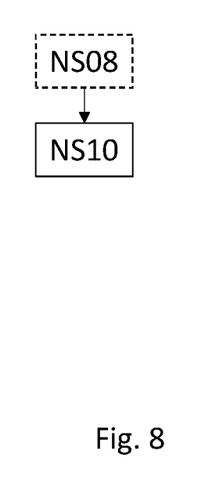
FIG. 8, showing a flow diagram of an exemplary method for operating a wireless precoding device.

FIG. 8 shows a flow diagram indicating an algorithm for a method for operating a wireless precoding device as described herein. The method may comprise an action NS10 of transmitting signaling based on precoding, the precoding being based on sampling information indicating a sample determining device used by another wireless device for preparing a measurement report. The method may comprise an optional step NS08 of receiving the sampling information and/or the measurement report.

Figure 9:
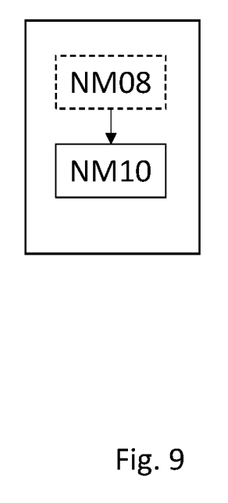
FIG. 9, showing an exemplary wireless precoding device.

FIG. 9 shows an exemplary network node for a RAN, e.g. a network node as described herein. The network node comprises a module NM10 for performing action NS10. Optionally, it may comprise a module NM08 for performing action NS08.

Some useful abbreviations comprise:
3GPP Third Generation Partnership Project
eNB Enhanced NodeB
CQI Channel-Quality Indicator
CRS Cell-Specific Reference Symbol
CSI Channel-State Information
CSI-IM CSI Interference Measurement
CSI-RS CSI Reference Symbol
DCI Downlink Control Information
HARQ Hybrid Automatic Repeat-reQuest
LTE Long Term Evolution
MAC Medium Access Control
MCS Modulation and Coding Scheme
MI Mutual Information
MIMO Multiple Input Multiple Output
NDI New Data Indicator
(e)PDCCH (enhanced) Physical Downlink Control Channel
PDU Protocol Data Unit
PMI Pre-coding Matrix Indicator
PRB Physical Resource Block
RAN Radio Access Network
RI Rank Indicator
RV Redundancy Version
RRC Radio Resource Control
TM Transmission Mode
TTI Transmission Time Interval
UE User Equipment There is also considered a program product comprising instructions adapted for causing control circuitry to carry out and/or control any method described herein, in particular when executed on the control circuitry.

A carrier or storage medium is also described, the storage medium storing a program product as described herein, and/or instructions adapted for causing control circuitry to carry out and/or control any method described, in particular when executed on the control circuitry.

A Radio Access Network (RAN) may be any kind of cellular and/or wireless radio network, which may be connected or connectable to a core network. The approaches described herein are particularly suitable for a 5G network, e.g. advance LTE and/or NR (New Radio), respectively successors thereof. A RAN may comprise one or more network nodes. A network node may in particular be a radio node adapted for radio and/or wireless and/or cellular communication with one or more terminals. A terminal may be any device adapted for radio and/or wireless and/or cellular communication with or within a RAN, e.g. a user equipment (UE) or mobile phone or smartphone or computing device or vehicular communication device or device for machine-type-communication (MTC), etc. A terminal may be mobile, or in some cases stationary. Transmitting in downlink may pertain to transmission from the network or network node to the terminal. Transmitting in uplink may pertain to transmission from the terminal to the network or network node.

Signaling may generally comprise one or more signals and/or one or more symbols. Reference signaling may comprise one or more reference signals or symbols. Reference signaling may be cell-specific or user-specific. A terminal or network node may be adapted to measure reference signaling, e.g. for demodulation and/or power control and/or to determine channel state information representing the transmission quality of a measured channel (representing the propagation of signaling using specific transmission parameters and/or the transmission path). Reference signaling may in particular be CSI-RS (Channel State Information Reference Signaling). It may be considered that reference signaling is received by the terminal.

A measurement report may generally represent information based on, and/or pertaining to, measurement/s that have been performed on reference signaling. The report type may pertain to the measurement report. A measurement report may comprise and/or indicate measurement samples and/or information pertaining thereto and/or parameters determined based on measurements performed, and/or information related to channel state or quality, e.g. CQI and/or PMI and/or RI. The report may contain values computed and/or estimated and/or calculated based on measurement results, as examples of a report being based on and/or determined based on measurements.

There is disclosed a carrier (or storage) medium arrangement carrying and/or storing at least any one of the program products described herein and/or code executable by control circuitry, the code causing the control circuitry to perform and/or control at least any one of the methods described herein. A carrier medium arrangement may comprise one or more carrier media. Generally, a carrier medium may be accessible and/or readable and/or receivable by control circuitry. Storing data and/or a program product and/or code may be seen as part of carrying data and/or a program product and/or code. A carrier medium generally may comprise a guiding/transporting medium and/or a storage medium. A guiding/transporting medium may be adapted to carry and/or carry and/or store signals, in particular electromagnetic signals and/or electrical signals and/or magnetic signals and/or optical signals. A carrier medium, in particular a guiding/transporting medium, may be adapted to guide such signals to carry them. A carrier medium, in particular a guiding/transporting medium, may comprise the electromagnetic field, e.g. radio waves or microwaves, and/or optically transmissive material, e.g. glass fiber, and/or cable. A storage medium may comprise at least one of a memory, which may be volatile or non-volatile, a buffer, a cache, an optical disc, magnetic memory, flash memory, etc.

A terminal may be implemented as a user equipment. A terminal or a user equipment (UE) may generally be a device configured for wireless device-to-device communication and/or a terminal for a wireless and/or cellular network, in particular a mobile terminal, for example a mobile phone, smart phone, tablet, PDA, etc. A user equipment or terminal may be a node of or for a wireless communication network as described herein, e.g. if it takes over some control and/or relay functionality for another terminal or node. It may be envisioned that terminal or a user equipment is adapted for one or more RATs, in particular LTE/E-UTRA. A terminal or user equipment may generally be proximity services (ProSe) enabled, which may mean it is D2D capable or enabled. It may be considered that a terminal or user equipment comprises radio circuitry and/control circuitry for wireless communication. Radio circuitry may comprise for example a receiver device and/or transmitter device and/or transceiver device. Control circuitry may include one or more controllers, which may comprise a microprocessor and/or microcontroller and/or FPGA (Field-Programmable Gate Array) device and/or ASIC (Application Specific Integrated Circuit) device. It may be considered that control circuitry comprises or may be connected or connectable to memory, which may be adapted to be accessible for reading and/or writing by the controller and/or control circuitry. It may be considered that a terminal or user equipment is configured to be a terminal or user equipment adapted for LTE/E-UTRAN. Reference signaling in the uplink may be associated to a terminal, e.g. SRS.

A radio node or network node or base station may be any kind of radio node or base station of a wireless and/or cellular network adapted to serve one or more terminals or user equipments. It may be considered that a base station is a node or network node of a wireless communication network. A radio node or network node or base station may be adapted to provide and/or define and/or to serve one or more cells of the network and/or to allocate frequency and/or time resources for communication to one or more nodes or terminals of a network. Generally, any node adapted to provide such functionality may be considered a base station. It may be considered that a base station or more generally a network node, in particular a radio network node, comprises radio circuitry and/or control circuitry for wireless communication. It may be envisioned that a base station or radio node is adapted for one or more RATs, in particular LTE/E-UTRA. Radio circuitry may comprise for example a receiver device and/or transmitter device and/or transceiver device. Control circuitry may include one or more controllers, which may comprise a microprocessor and/or microcontroller and/or FPGA (Field-Programmable Gate Array) device and/or ASIC (Application Specific Integrated Circuit) device. It may be considered that control circuitry comprises or may be connected or connectable to memory, which may be adapted to be accessible for reading and/or writing by the controller and/or control circuitry. A base station may be arranged to be a node of a wireless communication network, in particular configured for and/or to enable and/or to facilitate and/or to participate in cellular communication, e.g. as a device directly involved or as an auxiliary and/or coordinating node. Generally, a base station may be arranged to communicate with a core network and/or to provide services and/or control to one or more user equipments and/or to relay and/or transport communications and/or data between one or more user equipments and a core network and/or another base station and/or be Proximity Service enabled.

An eNodeB (eNB) may be envisioned as an example of a network node or radio node or base station, e.g. according to an LTE standard. A radio node or base station may generally be proximity service enabled and/or to provide corresponding services. It may be considered that a radio node base station is configured as or connected or connectable to an Evolved Packet Core (EPC) and/or to provide and/or connect to corresponding functionality. The functionality and/or multiple different functions of a radio node or base station may be distributed over one or more different devices and/or physical locations and/or nodes. A radio node or base station may be considered to be a node of a wireless communication network. Generally, a radio node or base station may be considered to be configured to be a coordinating node and/or to allocate resources in particular for cellular communication between two nodes or terminals of a wireless communication network, in particular two user equipments.

Beamformed transmission of signaling may comprise beamforming to transmit a beam pattern. Beamforming may be based on a precoder. A precoder may represent a beamforming configuration, in particular a mapping for a signal to a plurality of antenna elements, in particular for beamforming and/or MIMO operation. It may be considered that a precoder is represented by a matrix and/or comprises weights for controlling different antenna elements of a subarray for beamforming. A precoder, in particular a first or second precoder (e.g., of a first iteration described herein) may be associated to a codebook. A codebook may comprise a plurality of precoders associated to allowed beamforming configurations, e.g. based on a standard like LTE and/or operating conditions, based on which a standard-defined codebook for example may be limited. When beamforming, a desired signaling is provided by the overlay of the radiation patterns transmitted by the antenna elements of the subarray used for beamforming according to the precoder used. A precoder may generally be associated to and/or pertain to and/or address a subarray of antenna elements used for beamforming to provide the desired signaling (respectively port). Generally, a precoder may pertain to one or more, in particular two or more, (physical) antenna elements, which may be intended for use in transmission (e.g., provided with non-zero signal amplitude for transmission).

Precoding may comprise determining a precoder and/or providing a precoder for transmitting. Transmitting based on precoding and/or a precoder may comprise using the precoder/precoding to transmit, e.g. by controlling radio and/or antenna circuitry according to the precoding and/or precoder.

Signaling may comprise one or more signals and/or symbols, e.g. one or more reference signals or symbols like CSI-RS. A beam pattern (in particular, an angular and/or spatial distribution and/or field structure) may be associated to a port. An angular distribution may be represented by a two-dimensional/plane representation and/or a three-dimensional distribution, e.g. pertaining to a spatial or solid angle. Signaling may be associated to a part of the beam pattern. A beam pattern may in particular comprise a main lobe of radiation. Symbols or signals of signaling (respectively a port) may be defined to allow estimation of the associated channel by a receiver, e.g. a terminal like a UE. Estimation of a channel may comprise measurements of the signaling, in particular reference signals associated to the channel and/or port. Such measurements may comprise measurements related to amplitude and/or phase and/or frequency and/or duration and/or Signal-to-Noise (e.g., SINR, SIR and/or SNR). Different subarrays of an antenna array may differ in at least one antenna element.

Performing measurements may include measuring signaling, and/or performing processing based thereon, e.g. filtering, averaging, integrating, normalizing, scaling, weighting, determining and/or extracting and/or providing samples, etc. The latter may be based on, and/or performed by, a sample determining device, and/or be performed during measuring, or after, and/or while or before preparing a measurement report.

Obtaining and/or determining a precoder may comprise any form of acquiring information indicating the precoder, e.g. reading from a memory, receiving data indicating the precoder, and/or determining the precoder, e.g. based on received data like a measurement report.

Reference signaling may comprise one or more reference signals or symbols. Reference signals may be adapted or intended for a receiver (e.g., a terminal) to perform measurements on and/or to provide a measurement report on. Reference signals may be defined by a standard, e.g. CSI-RS defined by 3GPP standards, e.g. LTE or NR. Measurement reporting and/or providing a measurement report may generally comprise transmitting a measurement report, in particular to a source/transmitter of reference signaling, e.g. a network node, and/or performing measurements, e.g. on reference signaling, and/or evaluating measurements (e.g., processing the measurement results). A measurement report may be based on the performed measurements and/or the evaluating. Generally, reference signaling may be cell-specific or terminal-specific. CSI-RS may be considered an example for terminal-specific or user-specific reference signaling.

Configuring (e.g., with or for a configuration) a device like a terminal or network node may comprise bringing the device into a state in accordance with the configuration. A device may generally configure itself, e.g. by adapting a configuration. Configuring a terminal, e.g. by a network node, may comprise transmitting a configuration or configuration data indicating a configuration to the terminal, and/or instructing the terminal, e.g. via transmission of configuration data, to adapt the configuration configured.

A configuration may in particular pertain to measurement reporting, e.g. to a CSI process. Measurement reporting may generally pertain to specific signaling (or an associated port), which may be indicated or configured to the terminal by the network or network node, e.g. by transmitting corresponding configuration data. Measurement reporting may generally indicate a preferred port or port combination (or precoder or precoder combination) to be used, which may be referred to as port or precoder selection.

A CSI process may generally comprise receiving, from a network node, reference signaling (CSI-RS), and providing a measurement report based on the received reference signaling. The measurement report may in particular indicate or comprise CSI information, in particular CQI (Channel Quality Information), PMI (Precoding Matrix Indicator) and/or RI (Rank Indicator).

In this disclosure, for purposes of explanation and not limitation, specific details are set forth (such as particular network functions, processes and signaling steps) in order to provide a thorough understanding of the technique presented herein. It will be apparent to one skilled in the art that the present concepts and aspects may be practiced in other embodiments and variants that depart from these specific details.

For example, the concepts and variants are partially described in the context of Long Term Evolution (LTE) or LTE-Advanced (LTE-A) or Next Radio mobile or wireless communications technologies; however, this does not rule out the use of the present concepts and aspects in connection with additional or alternative mobile communication technologies such as the Global System for Mobile Communications (GSM). While the following embodiments will partially be described with respect to certain Technical Specifications (TSs) of the Third Generation Partnership Project (3GPP), it will be appreciated that the present concepts and aspects could also be realized in connection with different Performance Management (PM) specifications.

Moreover, those skilled in the art will appreciate that the services, functions and steps explained herein may be implemented using software functioning in conjunction with a programmed microprocessor, or using an Application Specific Integrated Circuit (ASIC), a Digital Signal Processor (DSP), a Field Programmable Gate Array (FPGA) or general purpose computer. It will also be appreciated that while the embodiments described herein are elucidated in the context of methods and devices, the concepts and aspects presented herein may also be embodied in a program product as well as in a system comprising control circuitry, e.g. a computer processor and a memory coupled to the processor, wherein the memory is encoded with one or more programs or program products that execute the services, functions and steps disclosed herein.

It is believed that the advantages of the aspects and variants presented herein will be fully understood from the foregoing description, and it will be apparent that various changes may be made in the form, constructions and arrangement of the exemplary aspects thereof without departing from the scope of the concepts and aspects described herein or without sacrificing all of its advantageous effects. The aspects presented herein can be varied in many ways.

The invention claimed is:

1. A wireless device for a Radio Access Network, the wireless device comprising:
   a sample determining device configured to:
      determine sampling information including at least a frequency variation to a reference signal of a radio channel used for channel estimation and a sample density in at least one of frequency and time properties of the radio channel used for channel estimation, the sample density being based at least on the frequency variation, the frequency variation being at least one of a coherence bandwidth and a delay spread;
      prepare a measurement report including at least the sampling information and the sample determining device used by the wireless device for preparing the measurement report; and
   the wireless device being configured to:
      transmit at least the measurement report.

2. The wireless device according to claim 1, wherein the sample determining device comprises a filter.

3. A method for operating a wireless device in a Radio Access Network, the wireless device comprising a sample determining device, the method comprising:
   determining sampling information including at least a frequency variation to a reference signal of a radio channel used for channel estimation and a sample density in at least one of frequency and time properties of the radio channel used for channel estimation, the sample density being based at least on the frequency variation, the frequency variation being at least one of a coherence bandwidth and a delay spread;
   preparing a measurement report including at least the sampling information and the sample determining device used by the wireless device for preparing the measurement report; and
   transmitting at least the measurement report.

4. The method according to claim 3, wherein the sample determining device comprises a filter.

5. A wireless precoding device for a Radio Access Network, the Radio Access Network supporting communication with at least a wireless device, the wireless precoding device being configured to:
   receive at least a measurement report including at least sampling information and a sample determining device used by the wireless device for preparing the measurement report, the sampling information including at least a frequency variation to a reference signal of a radio channel used for channel estimation and a sample density in at least one of frequency and time properties of the radio channel used for channel estimation, the sample density being based at least on the frequency variation, the frequency variation being at least one of a coherence bandwidth and a delay spread; and
   transmit signaling based on precoding, the precoding being based on the sampling information and the sample determining device used at least by the wireless device for preparing a measurement report.

6. The wireless precoding device according to claim 5, wherein transmitting signaling based on precoding is based on a representation of the sample determining device.

7. A method for operating a wireless precoding device in a Radio Access Network, the Radio Access Network supporting communication with at least a wireless device, the method comprising:
receiving at least a measurement report including at least sampling information and a sample determining device used by the wireless device for preparing the measurement report, the sampling information including at least a frequency variation to a reference signal of a radio channel used for channel estimation and a sample density in at least one of frequency and time properties of the radio channel used for channel estimation, the sample density being based at least on the frequency variation, the frequency variation being at least one of a coherence bandwidth and a delay spread; and
transmitting signaling based on precoding, the precoding being based on the sampling information and the sample determining device used at least by the wireless device for preparing a measurement report.

8. The method according to claim 7, wherein transmitting signaling based on precoding is based on a representation of the sample determining device.

9. A computer storage medium storing an executable computer program comprising instructions that when executed cause control circuitry to at least one of control and perform a method for operating a wireless device in a Radio Access Network, the wireless device comprising a sample determining device, the method comprising:
determining sampling information including at least a frequency variation to a reference signal of a radio channel used for channel estimation and a sample density in at least one of frequency and time properties of the radio channel used for channel estimation, the sample density being based at least on the frequency variation, the frequency variation being at least one of a coherence bandwidth and a delay spread;
preparing a measurement report including at least the sampling information and the sample determining device used by the wireless device for preparing the measurement report; and
transmitting at least the measurement report.

10. A wireless communication system comprising a wireless device for a Radio Access Network and a wireless precoding device for the Radio Access Network, the wireless device comprising:
a sample determining device configured to:
determine sampling information including at least a frequency variation to a reference signal of a radio channel used for channel estimation and a sample density in at least one of frequency and time properties of the radio channel used for channel estimation, the sample density being based at least on the frequency variation, the frequency variation being at least one of a coherence bandwidth and a delay spread;
prepare a measurement report including at least the sampling information and the sample determining device used by the wireless device for preparing the measurement report; and
the wireless device being configured to:
transmit at least the measurement report; and
the wireless precoding device being configured to:
receive at least the measurement report including at least the sampling information and the sample determining device used by the wireless device for preparing the measurement report, the sampling information including at least the frequency variation to the reference signal of the radio channel used for channel estimation and the sample density in at least one of frequency and time properties of the radio channel used for channel estimation, the sample density being based at least on the frequency variation; and
transmit signaling based on precoding, the precoding being based on the sampling information and the sample determining device used at least by the wireless device for preparing the measurement report.

11. The wireless communication system according to claim 10, wherein the sample determining device comprises a filter.

* * * * *